(12) United States Patent
Nguyen et al.

(10) Patent No.: US 9,121,870 B2
(45) Date of Patent: Sep. 1, 2015

(54) CLAMP METER WITH DETACHABLE CLAMP AND CLAMP STORAGE AREA

(75) Inventors: Evans H. Nguyen, Issaquah, WA (US); Jonathan P. Morrow, Mill Creek, WA (US); Jason R. Crowe, Milwaukee, WI (US); Zachary P. Haas, Seattle, WA (US); James V. Curtin, Seattle, WA (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 550 days.

(21) Appl. No.: 13/275,881

(22) Filed: Oct. 18, 2011

(65) Prior Publication Data

US 2012/0091998 A1    Apr. 19, 2012

Related U.S. Application Data

(60) Provisional application No. 61/394,185, filed on Oct. 18, 2010.

(51) Int. Cl.
*G01R 1/20* (2006.01)
*G01R 1/22* (2006.01)
(Continued)

(52) U.S. Cl.
CPC *G01R 1/22* (2013.01); *G01R 1/203* (2013.01); *G01R 1/04* (2013.01); *G01R 15/16* (2013.01)

(58) Field of Classification Search
CPC ...... G01R 1/203; G01R 15/16; G01R 15/142; G01R 15/207; G01R 19/0092
USPC ........ 324/115, 126, 127, 149; 333/24; 338/49
See application file for complete search history.

(56) References Cited

U.S. PATENT DOCUMENTS

| 853,255 A | 5/1907 | Miller |
| 3,555,420 A | 1/1971 | Schwartz |

(Continued)

FOREIGN PATENT DOCUMENTS

| DE | 2249278 | 4/1974 |
| DE | 7926478 | 2/1980 |

(Continued)

OTHER PUBLICATIONS

Fluke, i200/i200s AC Current Clamp Instruction Sheet, 2005, 4 pages.

(Continued)

*Primary Examiner* — Patrick Assouad
*Assistant Examiner* — Sean Curtis
(74) *Attorney, Agent, or Firm* — Michael Best & Friedrich LLP

(57) ABSTRACT

Clamp meter with detachable clamp and a clamp storage area. The clamp meter includes a clamp and a housing. The clamp includes a measurement end and a handle portion. The measurement end includes a first measurement portion and a second measurement portion. The handle portion includes a first handle and a second handle. The housing includes a recess configured to removably receive the clamp when the clamp is not in use. The housing is connected to the clamp via a cord. When the clamp is received in the recess, the first measurement portion and the second measurement portion are positioned completely within the recess, the first handle and the second handle extend at least partially from the recess, and the recess prevents the clamp from being used. The clamp is capable of being removed from the recess in a one-handed use position.

20 Claims, 15 Drawing Sheets

(51) Int. Cl.
*G01R 15/16* (2006.01)
*G01R 1/04* (2006.01)

(56) References Cited

U.S. PATENT DOCUMENTS

| | | | |
|---|---|---|---|
| 3,840,808 A | | 10/1974 | Liebermann |
| 3,962,630 A | | 6/1976 | Chaffee |
| 4,079,314 A | | 3/1978 | Jone |
| 4,096,434 A | * | 6/1978 | Meyer ........................... 324/115 |
| 4,232,578 A | | 11/1980 | Stellinger et al. |
| 4,259,635 A | | 3/1981 | Triplett |
| 4,378,525 A | | 3/1983 | Burdick |
| 4,696,189 A | | 9/1987 | Hochreuther |
| 5,170,114 A | | 12/1992 | Lowenstein et al. |
| 5,612,616 A | | 3/1997 | Earle |
| 5,652,506 A | | 7/1997 | Sorenson et al. |
| 6,018,238 A | * | 1/2000 | Shafie ........................ 324/117 R |
| 6,043,640 A | * | 3/2000 | Lauby et al. .................. 324/127 |
| 6,130,519 A | | 10/2000 | Whiting et al. |
| 6,137,285 A | | 10/2000 | Walsten et al. |
| 6,167,792 B1 | | 1/2001 | Korb et al. |
| 6,229,315 B1 | | 5/2001 | Briggs |
| D446,734 S | | 8/2001 | Kuramoto |
| D452,830 S | * | 1/2002 | Harju et al. ..................... D10/80 |
| D476,246 S | | 6/2003 | Kuramoto et al. |
| 6,586,923 B2 | | 7/2003 | Seike |
| 6,731,102 B2 | * | 5/2004 | Gregorec et al. ............ 324/99 D |
| 7,061,248 B1 | * | 6/2006 | Holland ........................ 324/508 |
| 7,225,714 B2 | | 6/2007 | Rompel et al. |
| 7,242,173 B2 | | 7/2007 | Cavoretto |
| 7,301,303 B1 | * | 11/2007 | Hulden ........................ 320/105 |
| 7,312,603 B2 | * | 12/2007 | Luo et al. ....................... 324/127 |
| 7,439,726 B2 | | 10/2008 | Luo et al. |
| 7,530,277 B2 | | 5/2009 | Miyasaka et al. |
| 7,659,710 B2 | | 2/2010 | Luo et al. |
| 8,251,157 B2 | * | 8/2012 | Gray et al. ...................... 173/29 |
| 8,274,273 B2 | * | 9/2012 | Nguyen et al. ................. 324/126 |
| 2002/0121877 A1 | * | 9/2002 | Smith et al. .................... 320/103 |
| 2005/0184722 A1 | * | 8/2005 | Gregorec, Jr. ................. 324/126 |
| 2007/0063689 A1 | | 3/2007 | Baker et al. |
| 2007/0252578 A1 | | 11/2007 | Luo et al. |
| 2007/0252579 A1 | | 11/2007 | Luo et al. |
| 2010/0134094 A1 | * | 6/2010 | Shah et al. ..................... 324/126 |
| 2010/0148756 A1 | * | 6/2010 | Shah et al. ..................... 324/126 |
| 2011/0012589 A1 | * | 1/2011 | Greenberg ..................... 324/127 |
| 2011/0015796 A1 | * | 1/2011 | Heydron et al. ............... 700/286 |

FOREIGN PATENT DOCUMENTS

| | | | | |
|---|---|---|---|---|
| DE | 3734365 | | 12/1988 | |
| DE | 19962323 | | 7/2001 | |
| DE | 10006023 | | 8/2001 | |
| EP | 0836099 | | 4/1998 | |
| EP | 0883815 | | 12/1998 | |
| EP | 1566641 | | 8/2005 | |
| GB | 829239 | | 3/1960 | |
| GB | 1565218 | | 4/1980 | |
| JP | 55101866 A | * | 8/1980 | ............... G01R 1/22 |
| JP | 56022964 | | 3/1981 | |
| JP | 06242171 | | 9/1994 | |
| WO | 9815841 | | 4/1998 | |
| WO | 2007127617 | | 11/2007 | |
| WO | 2009126824 | | 10/2009 | |

OTHER PUBLICATIONS

Fluke, i410/i1010 AC/DC Current Clamp Instruction Sheet, 2005, 9 pages.

Kyoritsu Electrical Instruments Works, Ltd., Catalogue: World Class Test and Measuring Instruments for a Global Marketplace, 2002, 48 pages.

Uei, Generation Two Phoenix Clamp Meter Series, 2008, 6 pages.

* cited by examiner

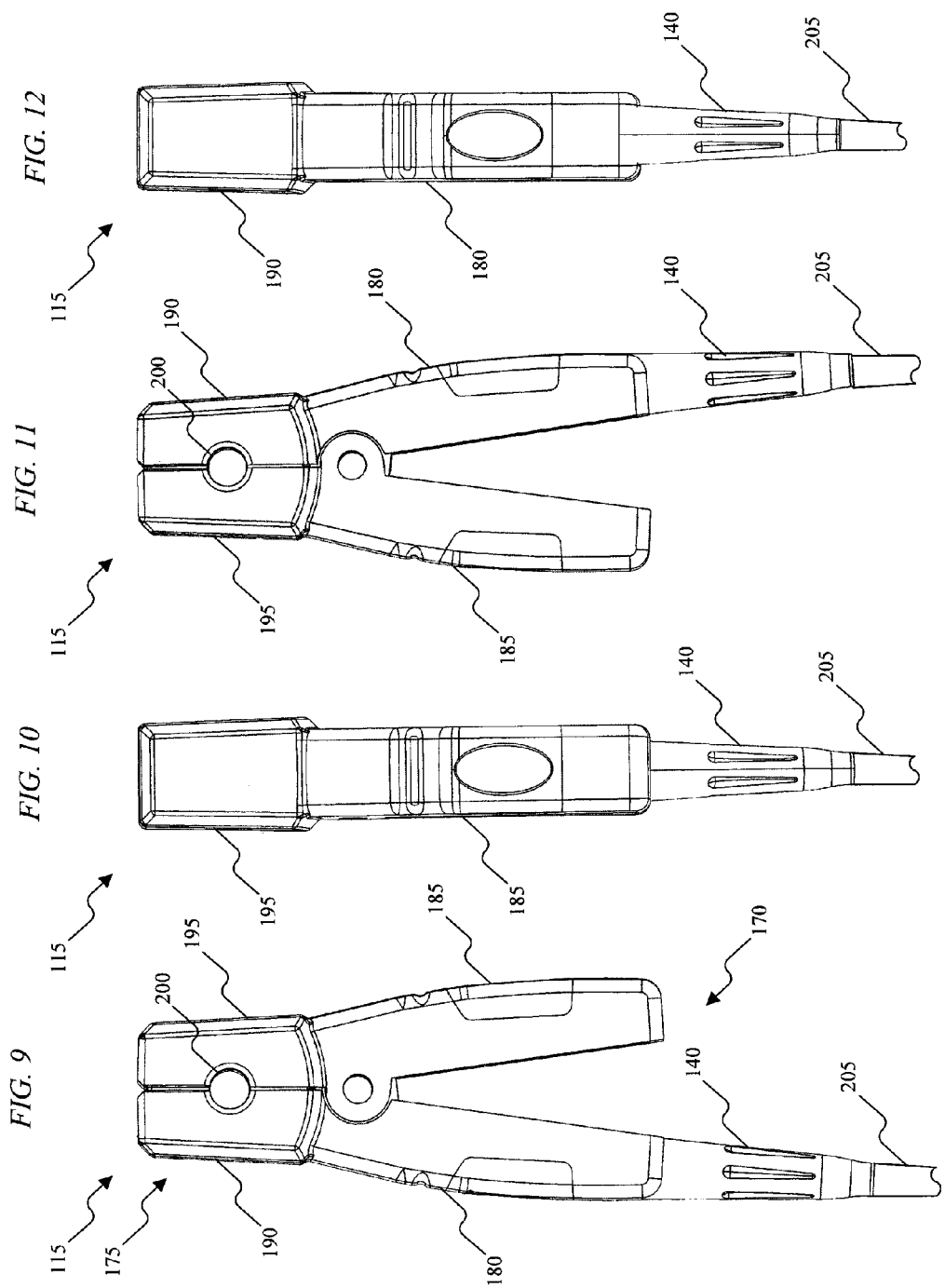

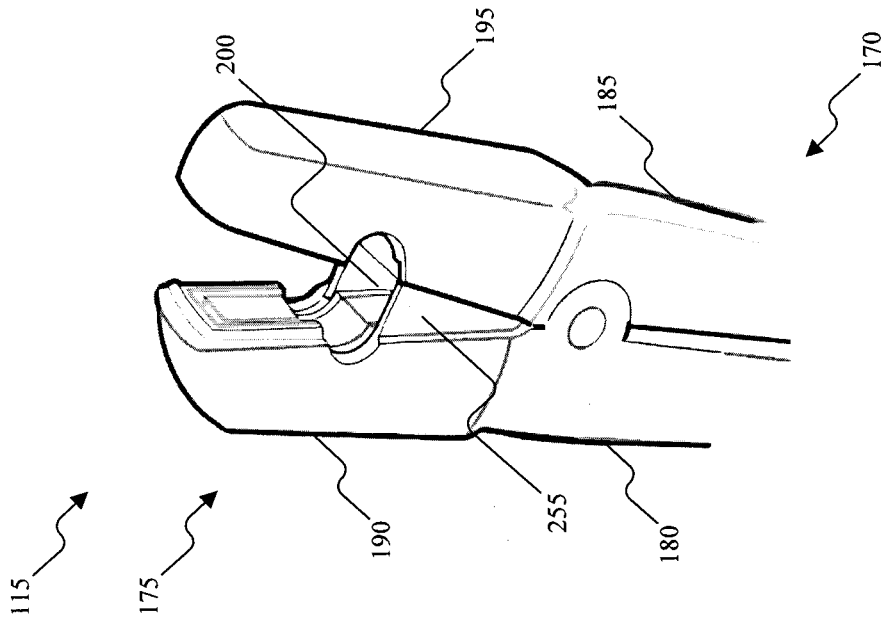
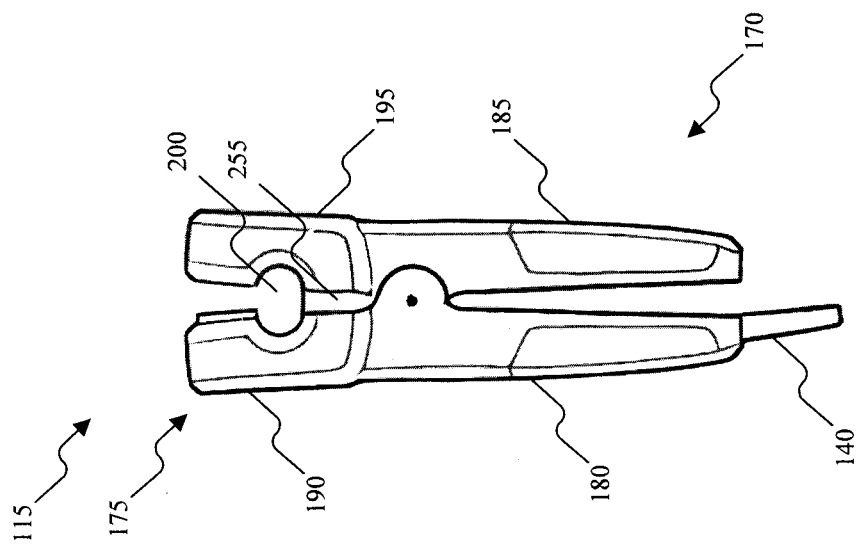

CLAMP METER WITH DETACHABLE CLAMP AND CLAMP STORAGE AREA

RELATED APPLICATIONS

This application claims the benefit of prior-filed, U.S. Provisional Patent Application No. 61/394,185, filed Oct. 18, 2010, the entire content of which is hereby incorporated by reference.

BACKGROUND

This invention relates to a clamp meter. Conventionally, clamp meters have a clamp integrated into a main housing. The clamp can be selectively opened and closed by actuating, for example, a lever.

SUMMARY

Such clamp meters are often limited by their size to the number and variety of places that they can be used to measure current. For example, a conventional clamp meter may not fit within the space between walls or be able to measure the current flowing through one of a plurality of wires that are bundled together. Accordingly, the invention provides a clamp meter that includes, among other things, a housing, a detachable clamp, and a storage area or recess within the housing for storing or stowing the detachable clamp. The storage area is configured to store the detachable clamp when the clamp is not in use.

In one embodiment, the invention provides a clamp meter that includes a clamp and a housing. The clamp includes a measurement end and a handle portion. The measurement end includes a first measurement portion and a second measurement portion. The handle portion includes a first handle and a second handle. The housing includes a recess configured to removably receive the clamp when the clamp is not in use. The housing is connected to the clamp via a cord. When the clamp is received in the recess, the first measurement portion and the second measurement portion are positioned completely within the recess, the first handle and the second handle extend at least partially from the recess, and the recess prevents the clamp from being used. The clamp is capable of being removed from the recess in a one-handed use position.

In another embodiment, the invention provides a method of operating a clamp meter that includes a clamp. The clamp includes a measurement end and a handle portion. The measurement end includes a first measurement portion and a second measurement portion. The handle portion includes a first handle and a second handle. The method includes removably receiving the clamp in a recess of a housing when the clamp is not in use. The first measurement portion and the second measurement portion of the clamp are positioned completely within the recess, and the first handle and the second handle extend at least partially from the recess. The clamp is connected to the housing via a cord. The method also includes preventing the clamp from being used when the clamp is received in the recess, and enabling use of the clamp when the clamp is removed from the recess.

Other aspects of the invention will become apparent by consideration of the detailed description and accompanying drawings.

BRIEF DESCRIPTION OF THE DRAWINGS

FIG. 9 is a front view of a clamp according to an embodiment of the invention.

FIG. 10 is a right-side view of the clamp of FIG. 9.

FIG. 11 is a rear view of the clamp of FIG. 9.

FIG. 12 is a left-side view of the clamp of FIG. 9.

FIGS. 19A and 19B illustrate the clamp of FIG. 9 including a pinch barrier according to an embodiment of the invention.

DETAILED DESCRIPTION

Figure 1:
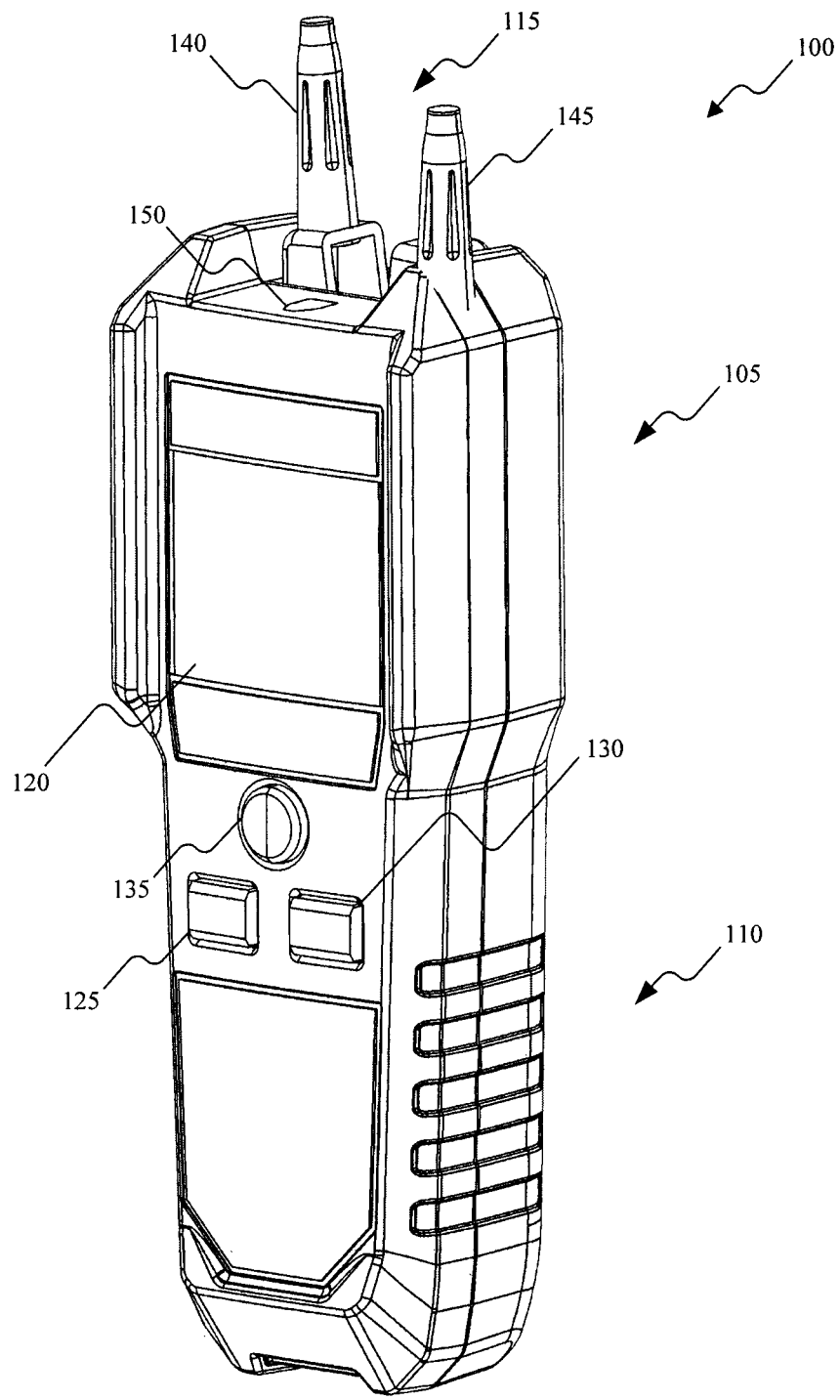
FIG. 1 is a front-perspective view of a clamp meter including a detachable clamp and a storage area according to an embodiment of the invention.
Figure 2:
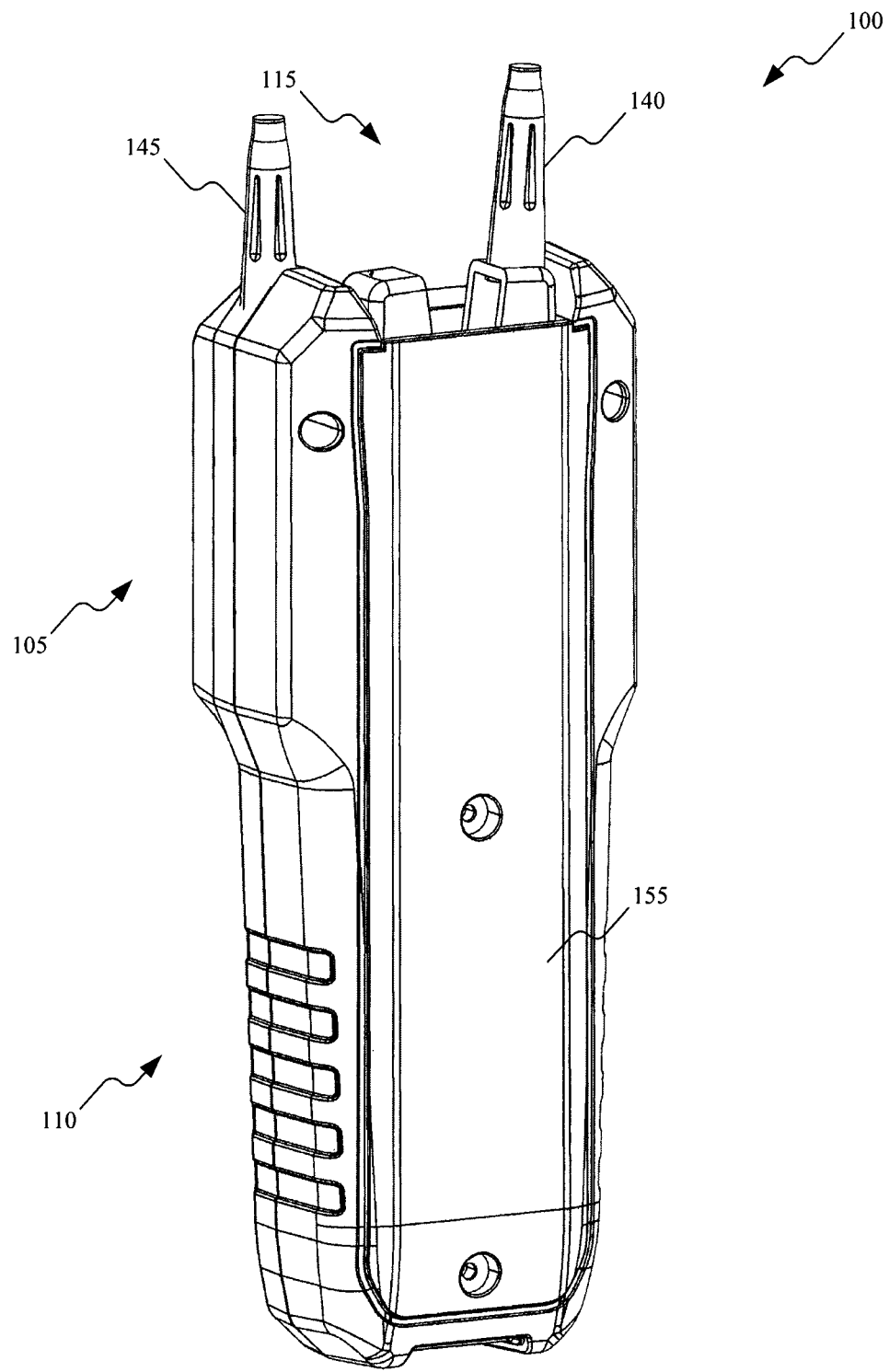
FIG. 2 is a rear-perspective view of the clamp meter of FIG. 1.
Figure 3:
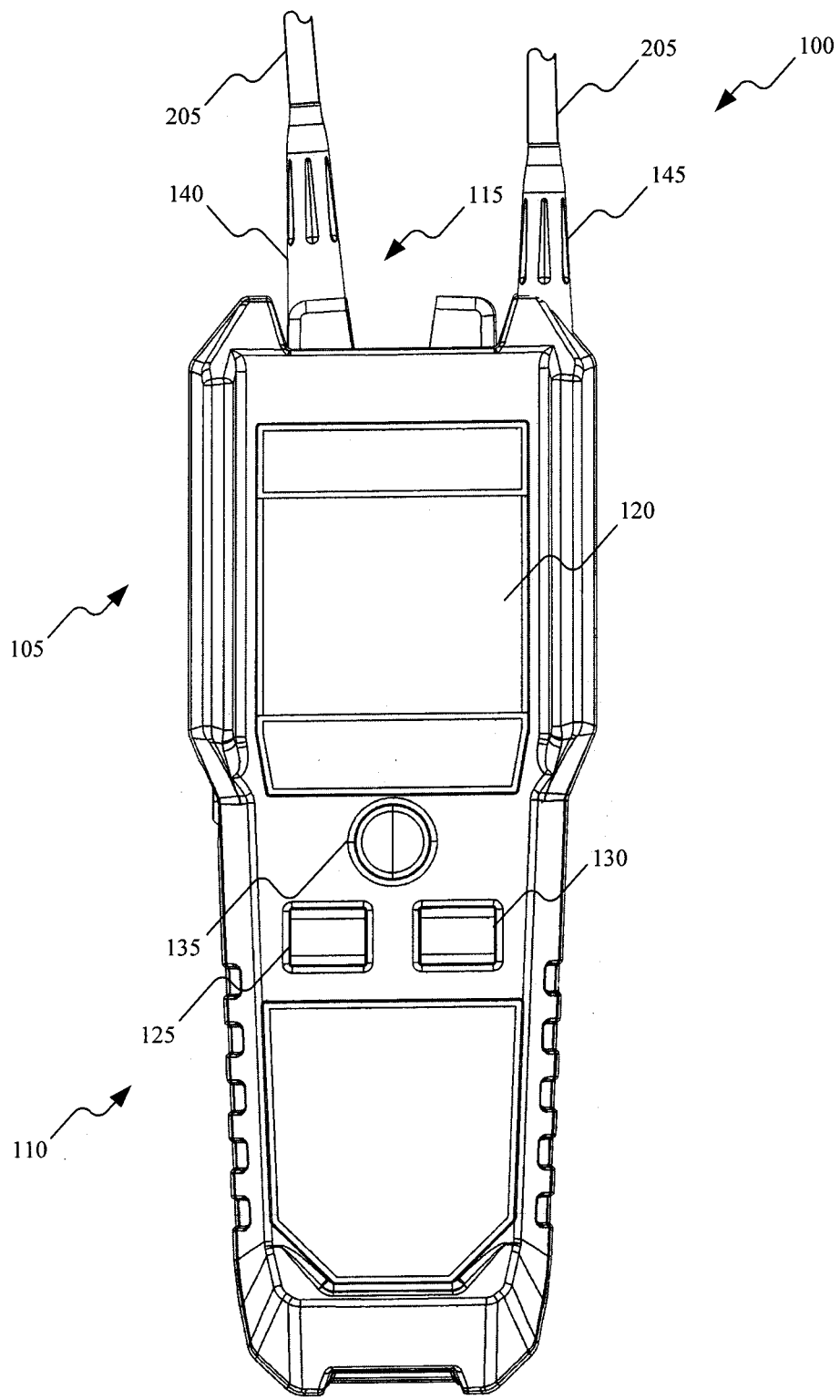
FIG. 3 is a front view of the clamp meter of FIGS. 1 and 2.
Figure 4:
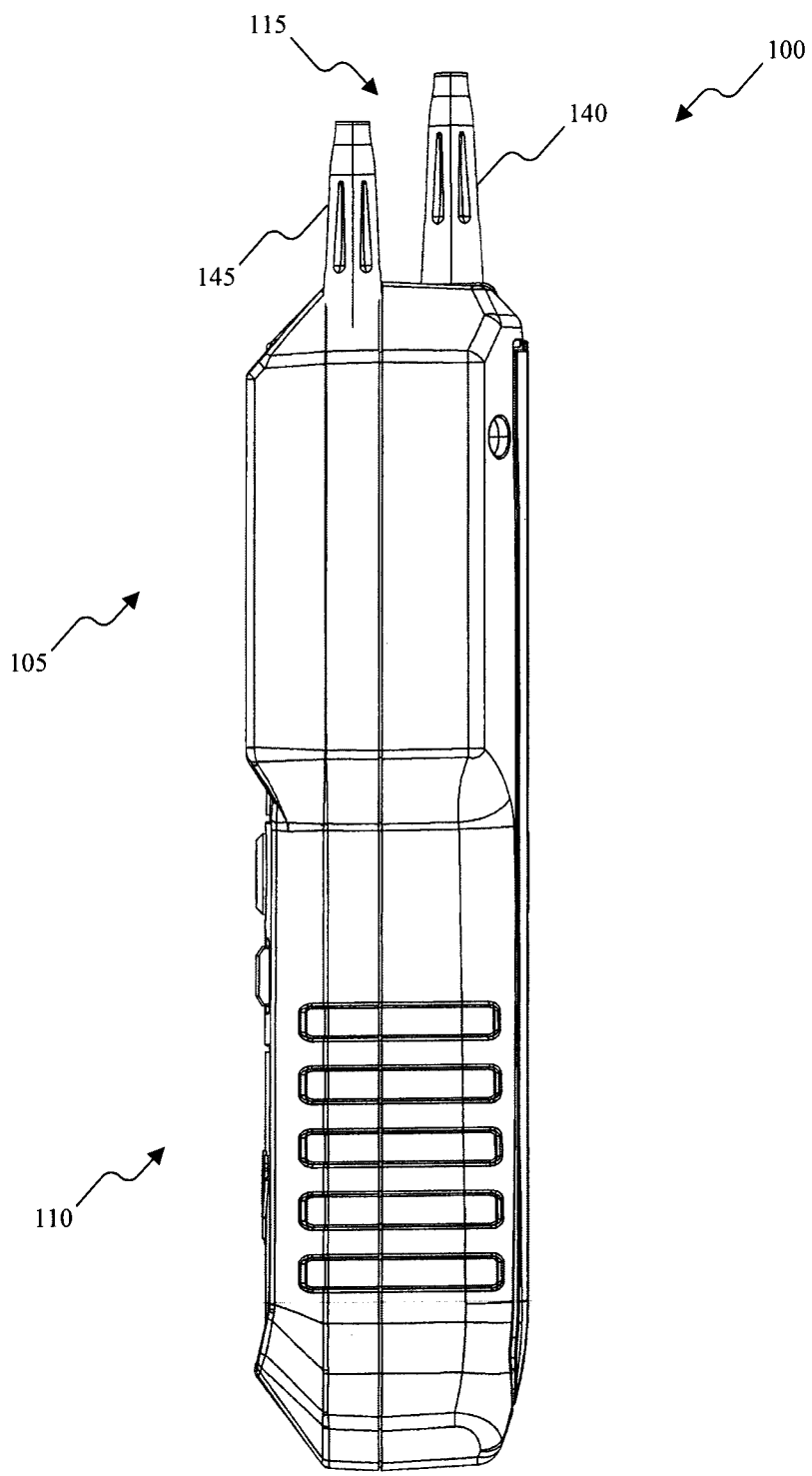
FIG. 4 is a right-side view of the clamp meter of FIGS. 1 and 2.
Figure 5:
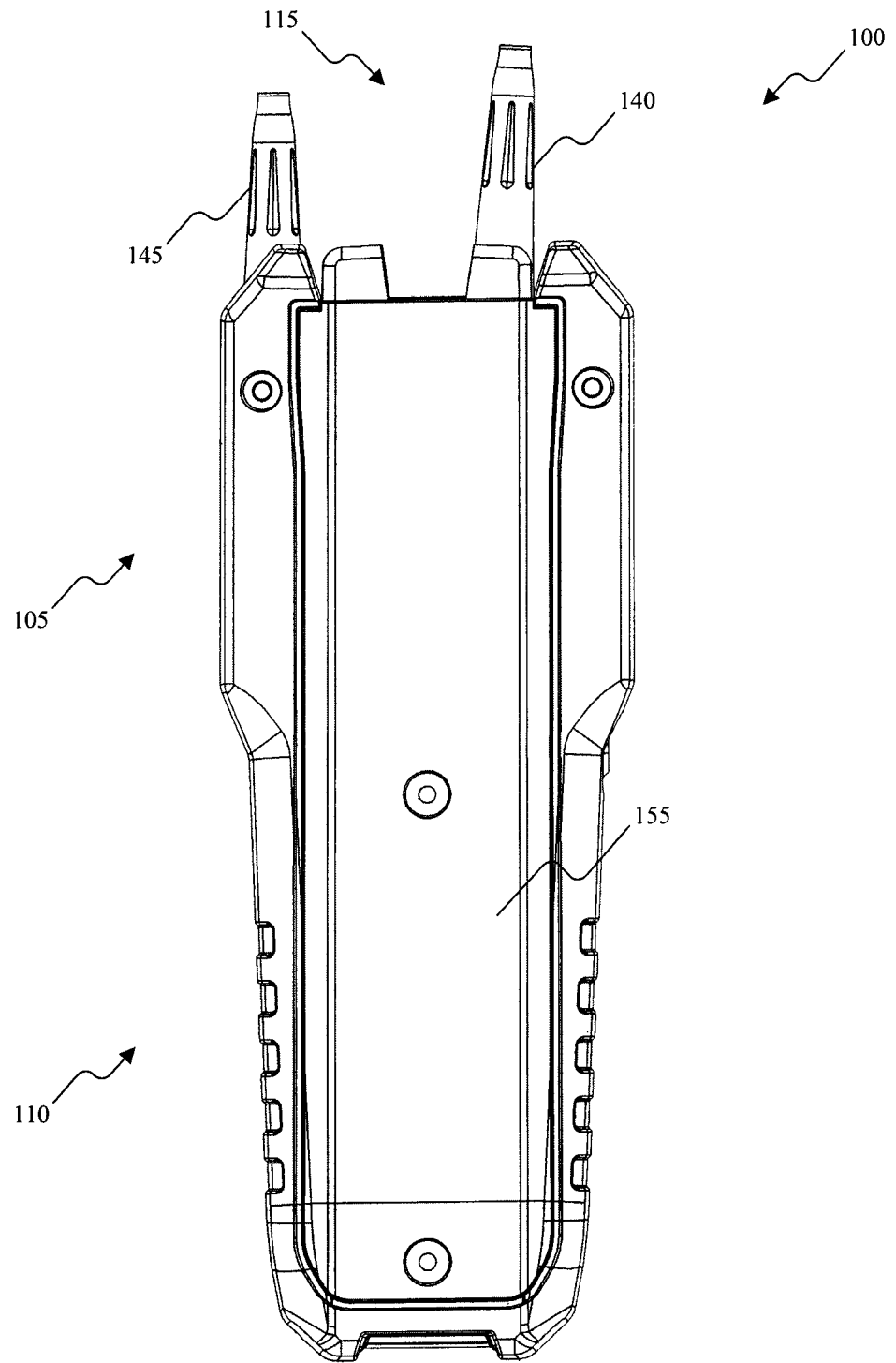
FIG. 5 is a rear view of the clamp meter of FIGS. 1 and 2.
Figure 6:
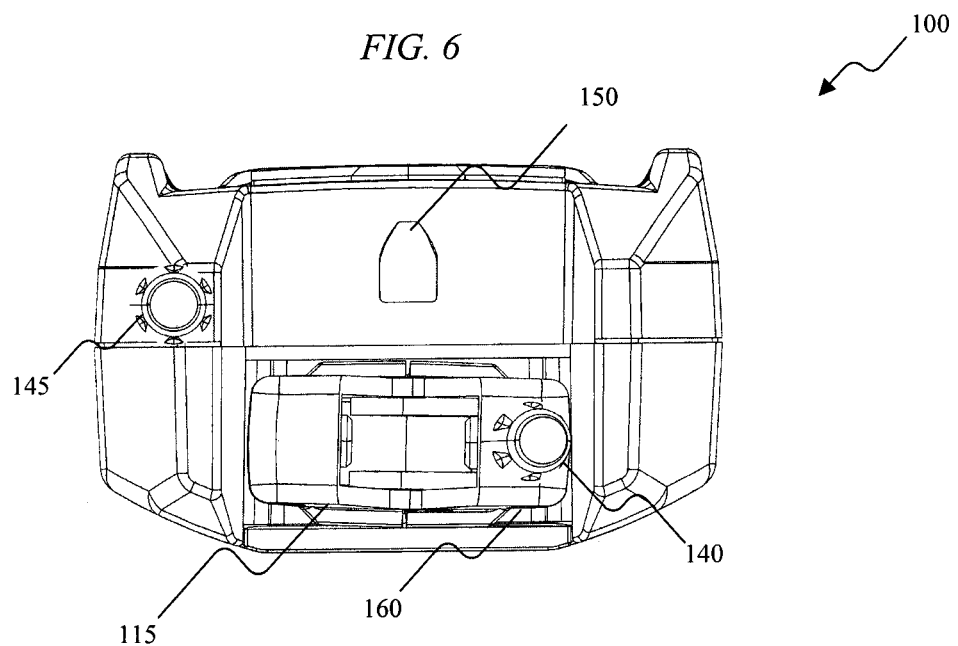
FIG. 6 is a top view of the clamp meter of FIGS. 1 and 2.
Figure 7:
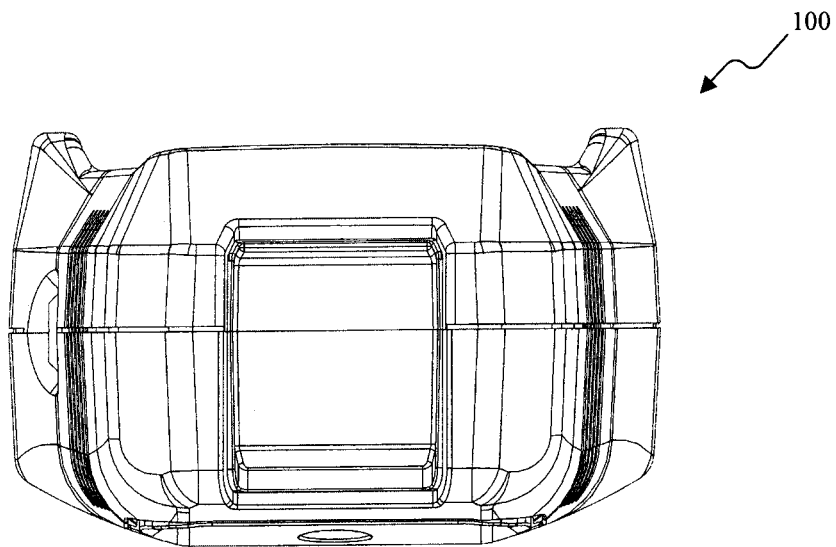
FIG. 7 is a bottom view of the clamp meter of FIGS. 1 and 2.
Figure 8:
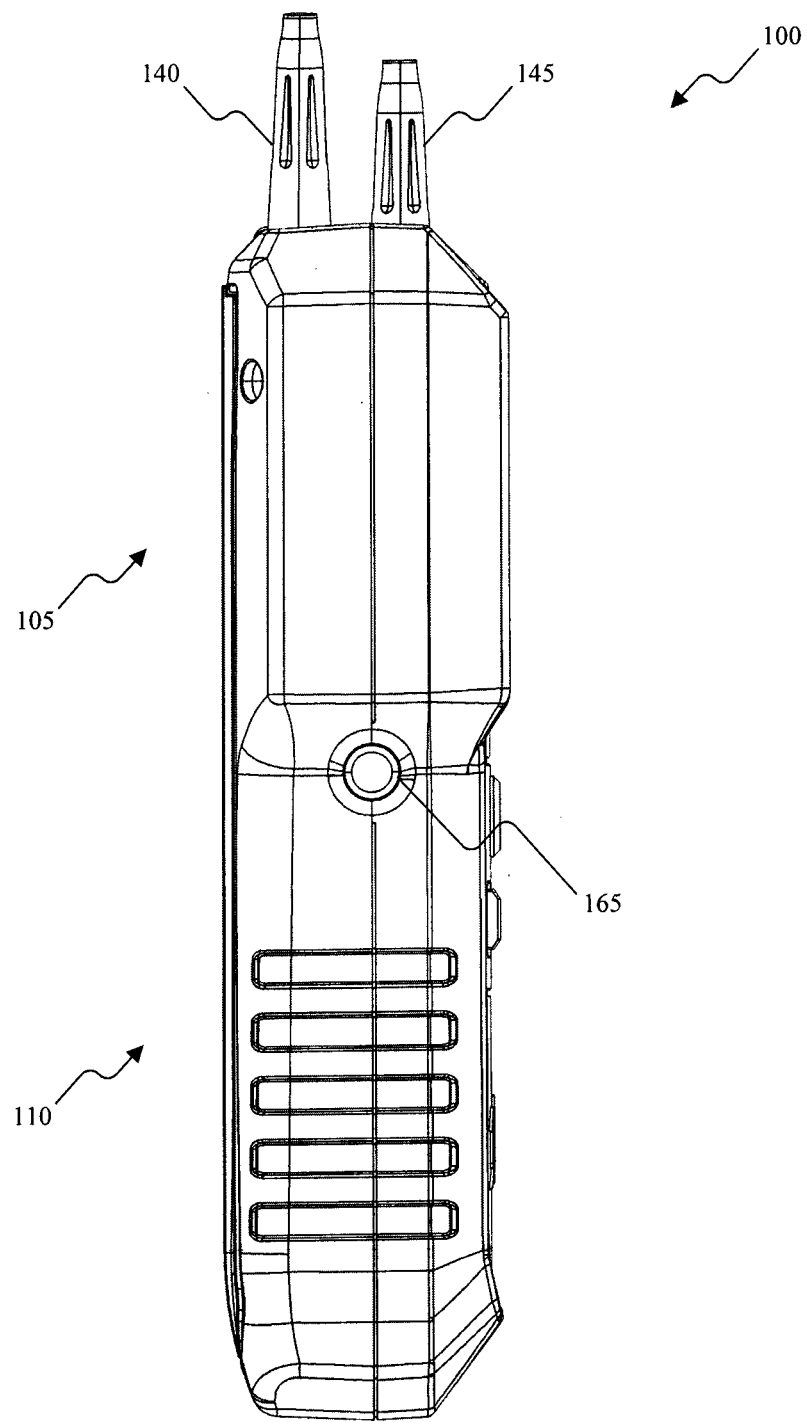
FIG. 8 is a left-side view of the clamp meter of FIGS. 1 and 2.
Figure 13:
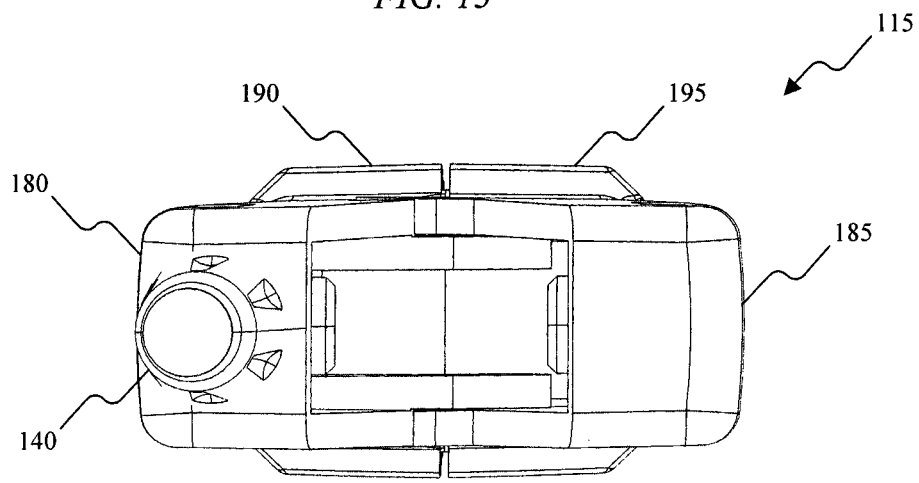
FIG. 13 is a bottom view of the clamp of FIG. 9.
Figure 14:
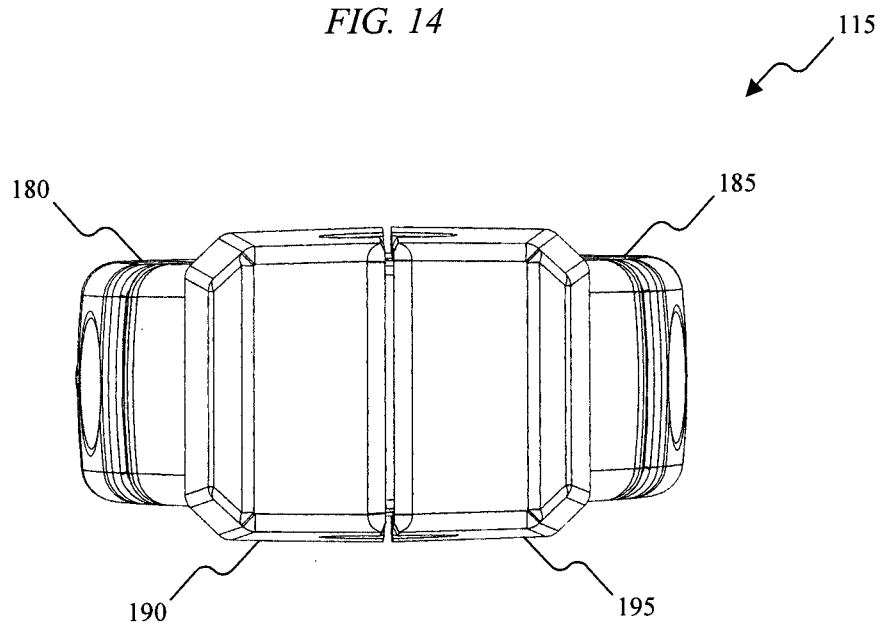
FIG. 14 is a top view of the clamp of FIG. 9.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

The invention described herein relates to a clamp meter that includes a housing and a detachable clamp. The detachable clamp is connected to the housing via a cord. The clamp is stored or stowed in a cavity or recess of the housing when not in use. The recess is configured to removably receive the clamp such that, when the clamp is stowed in the recess, the clamp is unable to be used to clamp a wire and take a current measurement. The clamp includes a first or measurement end and a second or handle end. The first end includes a first measurement portion and a second measurement portion. The clamp is operable to measure or sense a current passing between the first measurement portion and the second measurement portion when the clamp is removed from the recess. The second end includes a first handle and a second handle for a user to operatively grip and open the clamp. The recess is sized such that the first end of the clamp is positioned completely within the recess and the second end of the clamp at least partially protrudes from the recess. In such a configuration, the first handle and the second handle of the clamp can be grasped in order to remove the clamp from the recess in a one-handed use position without requiring a user to later readjust their grip on the handles. The clamp can then be used to clamp around a wire and measure a current associated with the wire.

A clamp meter 100 according to an embodiment of the invention is illustrated in FIGS. 1-8. The clamp meter 100 includes an upper housing or main housing portion 105, a lower housing or handle portion 110, a detachable clamp 115, a display 120, a first button 125, a second button 130, a third button 135, a first electrical connection 140 to a cord, a second electrical connection 145 to a cord, and a worklight (e.g., an LED worklight) 150. In some embodiments, the upper housing portion 105 and the lower housing portion 110 are collectively referred to as the housing of the clamp meter 100. The clamp meter 100 also includes a back cover 155 (see FIG. 2) that forms a recess or storage area 160 (see FIG. 6). The recess 160 is accessible from the upper housing portion 105 of the clamp meter 100 for receiving the clamp 115. The first button 125 is, for example, a hold button for maintaining a current measurement on the display 120. The second button 130 is, for example, a zero button for zeroing or clearing a displayed measurement. The third button 135 is, for example, a power button that is operable to selectively enable or disable the clamp meter from drawing power from one or more batteries (not shown) within the clamp meter 100. The worklight 150 is activated and deactivated using a worklight button 165 (see FIG. 8) on the left side of the clamp meter 100. The worklight 150 can include an incandescent light bulb, a plurality of light emitting diodes, or the like. In one embodiment, the worklight 150 includes one or more high-intensity LEDs and has an output of, for example, 100-250 LUX at a distance of two feet. In some embodiments of the invention, the output of the worklight 150 is greater than 250 LUX at a distance of two feet. The worklight 150 can also include a timeout period. The worklight timeout period can have a preprogrammed value or be set by the user. If the worklight timeout period is reached or lapses and the worklight 150 has not been turned off, the clamp meter 100 can turn off the worklight 150 to conserve power.

The clamp meter 100 is configured such that the clamp 115 can be stored or stowed in the recess 160 when the clamp 115 is not in use. Storing the clamp 115 in the recess 160 when not in use prevents a measurement end of the clamp 115 (described below) from being accessed and protects the clamp 115 from damage or contact with an environment. Also, storing the clamp 115 in the recess 160 allows a user to detach the clamp from the housing using a handle portion of the clamp 115 (also described below). As such, the clamp 115 can be detached from the clamp meter 100 in a use position (e.g., the user is not required to adjust or manipulate their grip after detaching the clamp 115 from the clamp meter 100).

FIGS. 9-14 illustrate the clamp 115. The clamp 115 includes a handle end 170 and a measurement end 175. The handle end 170 includes a first handle 180 and a second handle 185. The measurement end 175 includes a first measurement portion 190 and a second measurement portion 195. The measurement end of the clamp 115 is inserted into and received in the recess 160 prior to the handle end 170. When the first measurement portion 190 and the second measurement portion 195 are in contact with one another, a measurement recess 200 is formed. The measurement recess 200 is configured and sized to receive, for example, a wire. The first measurement portion 190 and the second measurement portion 195 are normally biased into contact with one another by a spring (not shown) between the first handle 180 and the second handle 185. The spring is operable to force the first handle 180 and the second handle 185 away from one another in the absence of an external force being applied to the handles 180 and 185. The one-handed use position allows a user to overcome the biasing force of the spring after removing the clamp 115 from the recess 160 without having to readjust or modify their grip. For example, the one-handed use position allows for the removal of the clamp 115 from the recess 160 using both the first handle 180 and the second handle 185. Once removed, a user's hand is already positioned on each of the first handle 180 and the second handle 185 in such a manner that the clamp 115 can be used (e.g., the handles 180 and 185 can be moved toward each other to open the measurement recess 200 such that the measurement recess 200 can receive a wire). In some embodiments, the one-handed use position refers to a user's grip on both the first handle 180 and the second handle 185, and the use of the clamp 115 refers to squeezing the first handle 180 and the second handle 185 toward one another in order to open the measurement recess 200 for receiving a wire.

Figure 15:
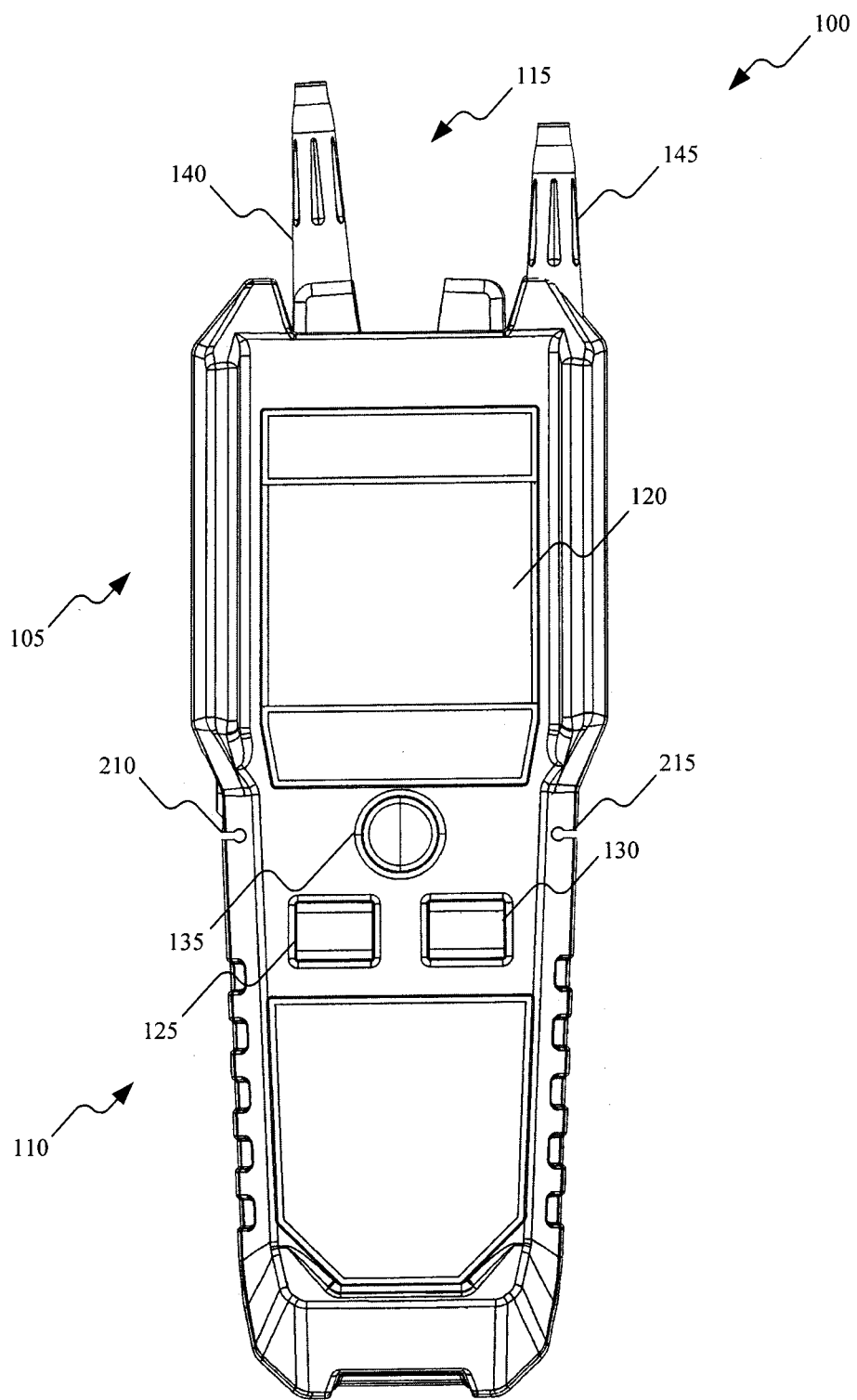
FIG. 15 illustrates a cord management system according to an embodiment of the invention.
Figure 16:
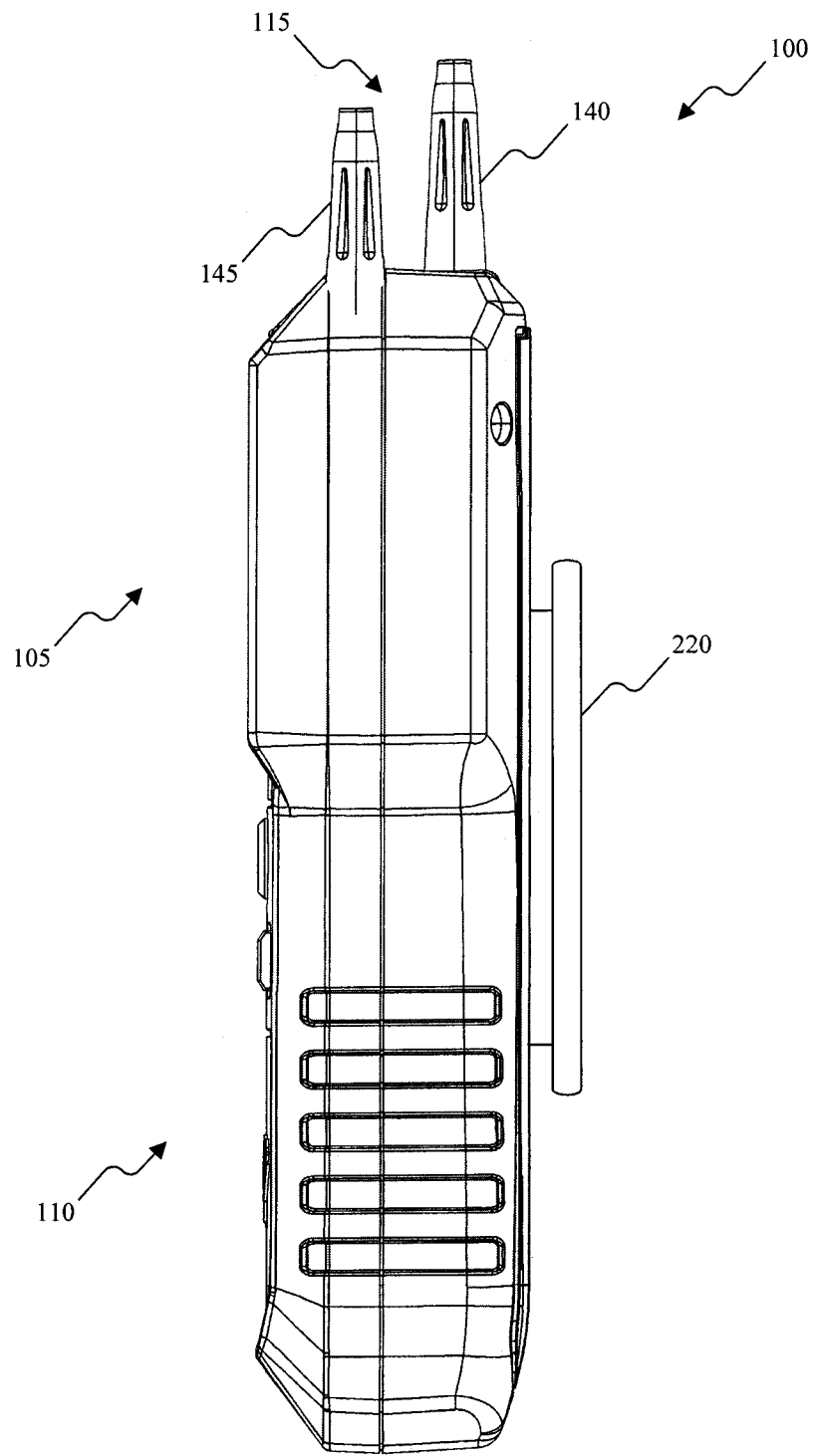
FIG. 16 illustrates a cord management system according to another embodiment of the invention.

In some embodiments, the clamp meter 100 also includes a cord management system or device configured to organize a cord 205 between the upper housing of the clamp meter 100 and the clamp 115. For example, in FIG. 15, the clamp meter 100 includes a first recess 210 and a second recess 215. The first recess 210 and the second recess 215 are configured to receive the cord 205 and hold the cord 205 via a friction fitting between an interior surface of the recesses 210 and 215 and the cord 205. As an illustrative example, the cord 205 can be wrapped around the upper housing portion 105 or the handle portion 110. When a sufficient amount of the cord 205 has been wrapped (e.g., such that there is still enough cord left to stow the clamp 115 in the recess 160), the cord 205 can be inserted or pressed into the recesses 210 and 215 to secure the cord 205 to the clamp meter 100. FIG. 16 illustrates a cord management system that includes a protrusion 220 connected to the back cover 155. The protrusion 220 is configured such that the cord 205 can be wrapped around a smaller or interior portion of the protrusion 220.

Figure 17:
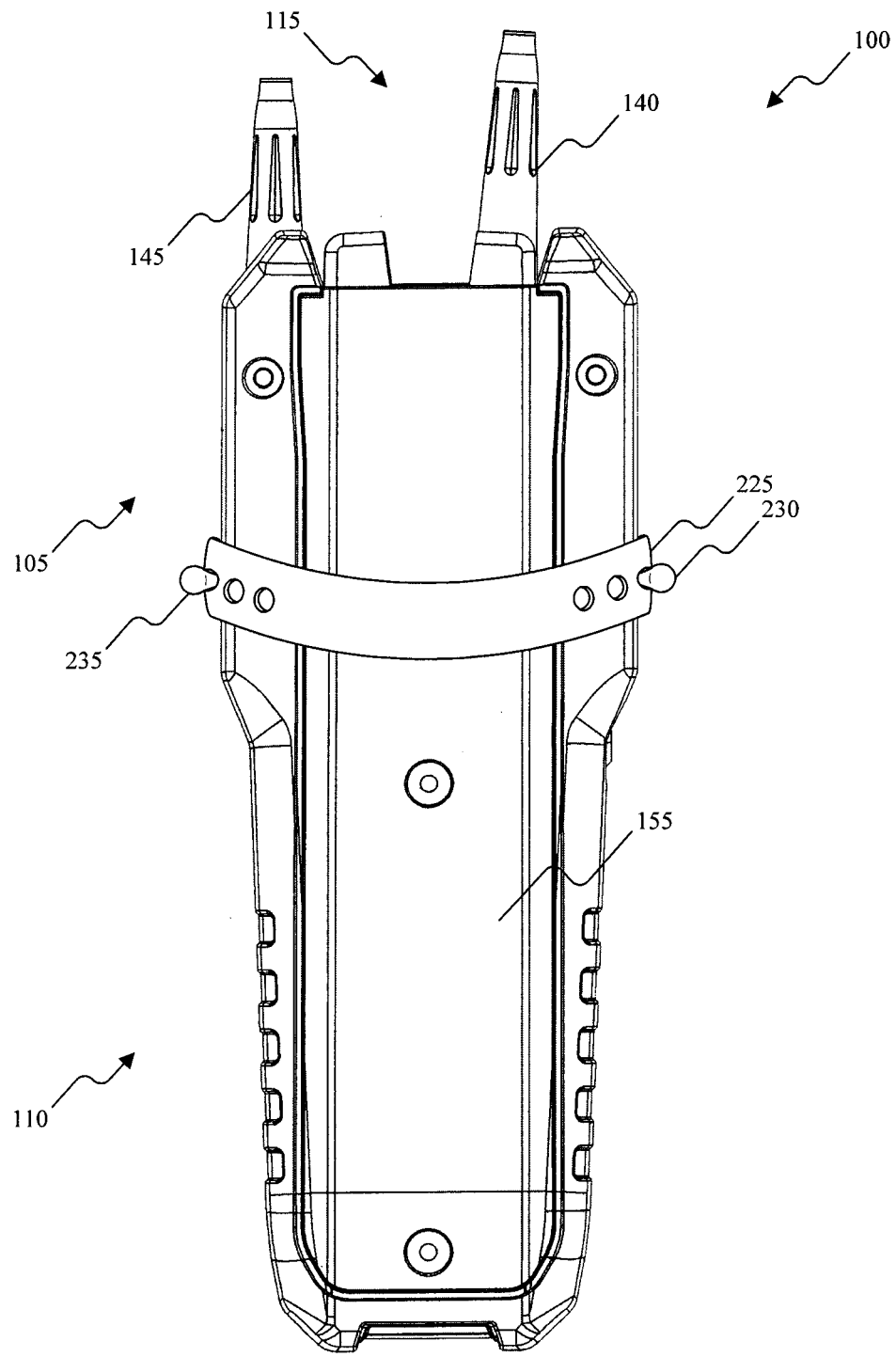
FIG. 17 illustrates a cord management system according to another embodiment of the invention.

FIG. 17 illustrates a cord management system for the clamp meter 100 that includes a strap 225, a first retention member 230, and a second retention member 235. The strap 225 can be tightened around the clamp meter 100 and the cord 205 in order to secure the cord 205 to the clamp meter 100. The first retention member 230 and the second retention member 235 are, for example, an extension of the upper housing portion 105 or are connected to an opposite end of the strap 225 for tightening the strap 225 around the clamp meter 100. For each of the cord management systems described above, cord management reduces the amount of the cord 205 that hangs from the housing of the clamp meter 100 and allows a user to control the length of the cord 205 when the detachable clamp 115 is in use (i.e., is detached from the housing) or is stowed.

Figure 18A:
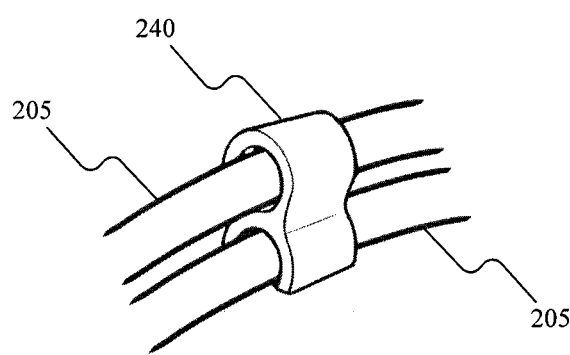
FIGS. 18A and 18B illustrate a cord management system according to another embodiment of the invention.
Figure 18B:
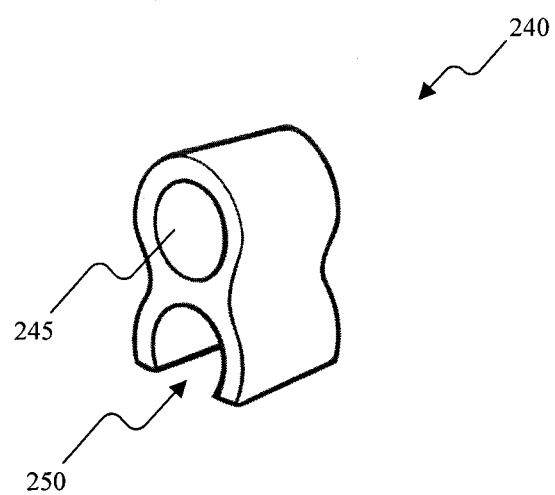

FIGS. 18A and 18B illustrate a cord management system 240 that includes a first aperture 245 and a second aperture 250 for securing the cord 205. The cord management system 240 is made of, for example, rubber or a similar resilient material. The cord 205 is passed through the first aperture 245. For example, the cord management system 240 is placed on the cord 205 at the time of manufacture, or the cord management system 240 is selectively opened to receive the cord 205 in the first aperture 245. In some embodiments, the cord 205 is resiliently closed around the cord 205. The second aperture 250 is, for example, C-shaped and is also configured to removably receive the cord 205. In some embodiments, the cord 205 is received in the first aperture 245, is wrapped around the clamp meter 100, and is received in the second aperture 250 in order to secure the cord 205 to the clamp meter 100. In other embodiments, the cord management system 240 can be used in conjunction with the cord management systems described above with respect to FIGS. 15-17.

FIGS. 19A and 19B illustrate the clamp 115 of the clamp meter 100 including a mechanical wire-block or pinch barrier 255 between the first measurement portion 190 and the second measurement portion 195. The first measurement portion 190 and the second measurement portion 195 are opened such that the measurement recess 200 is able to receive a wire or other conductor. When the first measurement portion 190 and the second measurement portion 195 are open, the pinch barrier 255 prevents the wire or conductor from being pinched by the clamp 115. For example, the wire is prevented from extending below the measurement recess 200. As illustrated in FIG. 19B, the pinch barrier 255 extends from the first measurement portion 190 and is received in the second measurement portion 195. The pinch barrier is sized and configured such that, when the clamp 115 is fully-opened (e.g., the first handle 180 and the second handle 185 are fully pressed together) the pinch barrier 255 is fully or at least partially engaged with the second measurement portion 195.

Figure 20:
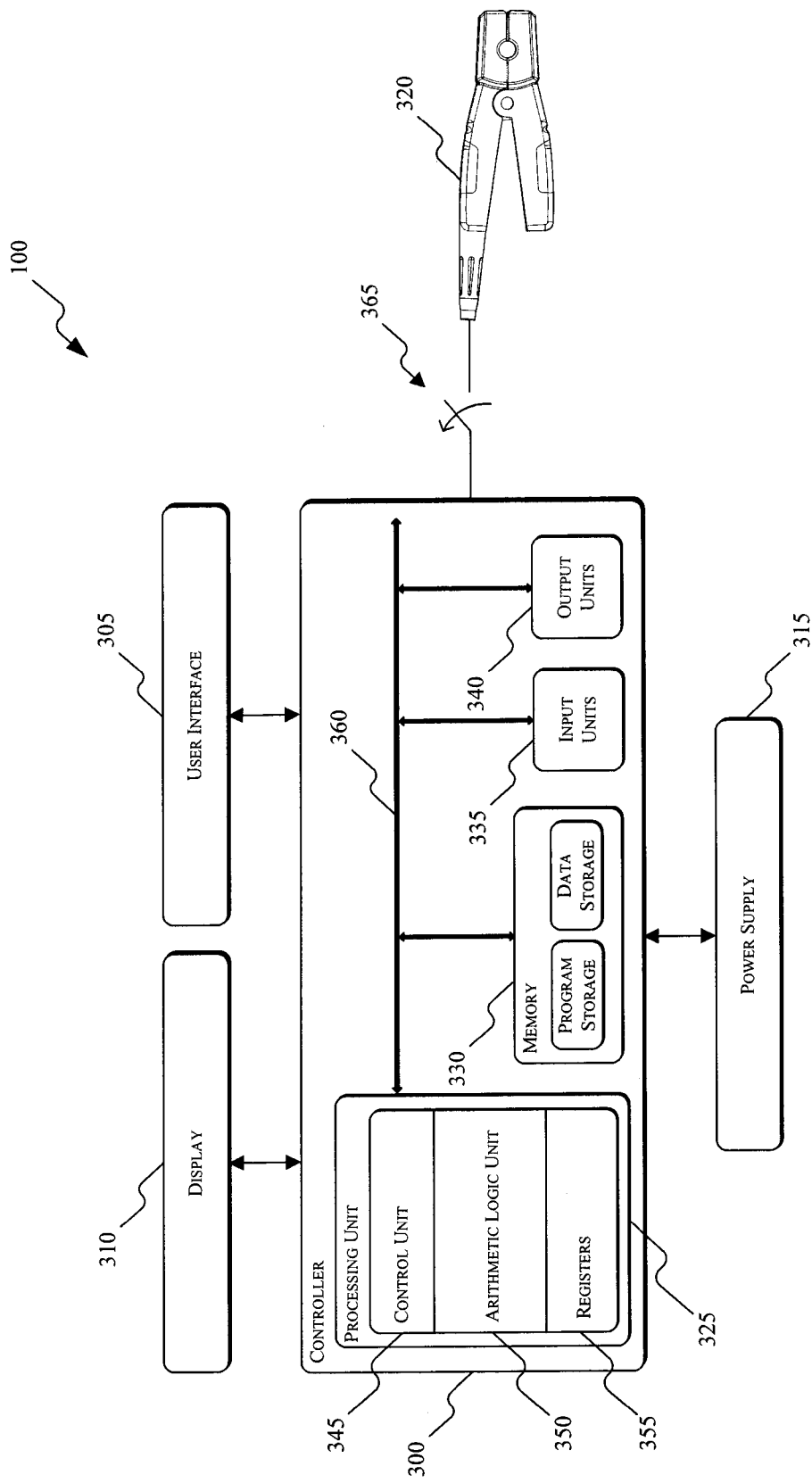
FIG. 20 illustrates a controller for a clamp meter according to an embodiment of the invention.

FIG. 20 illustrates a controller 300 for the clamp meter 100. The controller 300 is electrically and/or communicatively connected to a variety of modules or components of the clamp meter 100. For example, the illustrated controller 300 is connected to a user interface module 305, a display 310 (illustrated as display 120 in FIG. 1), a power supply module 315, and a clamp 320. The controller 300 includes combinations of hardware and software that are operable to, among other things, selectively enable or disable the measurement of a current using the clamp 320.

In some constructions, the controller 300 includes a plurality of electrical and electronic components that provide power, operational control, and protection to the components and modules within the controller 300 and/or clamp meter 100. For example, the controller 300 includes, among other things, a processing unit 325 (e.g., a microprocessor, a microcontroller, or another suitable programmable device), a memory 330, input units 335, and output units 340. The processing unit 325 includes, among other things, a control unit 345, an arithmetic logic unit ("ALU") 350, and a plurality of registers 355 (shown is a group of registers in FIG. 20) and is implemented using a known computer architecture, such as a modified Harvard architecture, a von Neumann architecture, etc. The processing unit 325, the memory 330, the input units 335, and the output units 340, as well as the various modules connected to the controller 300 are connected by one or more control and/or data buses (e.g., common bus 360). The control and/or data buses are shown generally in FIG. 20 for illustrative purposes. The use of one or more control and/or data buses for the interconnection between and communication among the various modules and components would be known to a person skilled in the art in view of the invention described herein. In some embodiments, the controller 300 is implemented partially or entirely on a semiconductor (e.g., a field-programmable gate array ["FPGA"] semiconductor) chip, such as a chip developed through a register transfer level ("RTL") design process. In some embodiments, the clamp meter 100 is configured to operate in a manner similar to the clamp meter described in International Patent Application Publication No. WO2009/126824, entitled "TEST AND MEASUREMENT DEVICE WITH A PISTOL-GRIP HANDLE," the entire content of which is hereby incorporated by reference.

The memory 330 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 325 is connected to the memory 330 and executes software instructions that are capable of being stored in a RAM of the memory 330 (e.g., during execution), a ROM of the memory 330 (e.g., on a generally permanent basis), or another non-transitory computer readable medium such as another memory or a disc. Software included in the implementation of the clamp meter 100 can be stored in the memory 330 of the controller 300. The software includes, for example, firmware, one or more applications, program data, filters, rules, one or more program modules, and other executable instructions. In other constructions, the controller 300 includes additional, fewer, or different components.

The power supply module 315 supplies a nominal DC voltage to the controller 300 or other components or modules of the clamp meter 100. The power supply module 315 is powered by, for example, one or more batteries or battery packs. The power supply module 315 can also be configured to supply lower voltages to operate other circuits and/or components within the controller 300 or clamp meter 100.

The user interface module 305 includes a combination of digital and analog input or output devices required to achieve a desired level of control and monitoring for the clamp meter 100. The user interface module 305 can include a plurality of knobs, dials, switches, buttons, etc. For example, the user interface module includes the first button 125, the second button 130, the third button 135, and the worklight button 165. The display 310 is, for example, a liquid crystal display ("LCD"), a light-emitting diode ("LED") display, an organic LED ("OLED") display, an electroluminescent display ("ELD"), a surface-conduction electron-emitter display ("SED"), a field emission display ("FED"), a thin-film transistor ("TFT") LCD, or the like. In some embodiments, the display 310 is also an input device such as a touch-screen display. The display is operable to display an indication of, for example, a sensed current between the first measurement portion 190 and the second measurement portion 195.

In the illustrated embodiment, the clamp meter 100 also includes a switch 365 that is configured to disable (i.e., render inoperable) the clamp 320 when stored in the recess 160. The switch is, for example, a single pole, single throw switch, a magnetic switch, or another suitable switch that is configured to electrically isolate the clamp 320. The switch 365 is in an open state when the clamp 320 is inserted into and stowed in the recess 160. The switch 365 is in a closed state when the clamp 320 is removed from the recess 160. In some embodiments, one or more solid-state switches (e.g., field-effect transistors ["FETs"], metal-oxide-semiconductor FETs ["MOSFETs"], bipolar junction transistors ["BJTs"], etc.) can be used to electrically disconnect the clamp 320 from the controller 300. For example, a permanent magnet may be embedded in the clamp 320 for closing a magnetic switch. Closing the magnetic switch then causes one or more solid-state switches to enter a non-conductive state which electrically isolates the clamp 320 from a measurement portion (e.g., the processing unit 325) of the controller 300. Disabling the clamp 320 when in the recess 160 provides an additional level of safety to the clamp meter 100. As such, in addition to the measurement end 175 of the clamp 115 being inaccessible (i.e., unusable) when in the recess 160, the clamp 115 is also unable to measure current (i.e., is non-functional). Opening the switch 365 disables the ability of the clamp 320 to take current measurements. Other functions of the clamp meter 100 remain operational when the switch 365 is opened, such as the worklight 150 and the display 310. For example, the worklight 150 can be selectively activated when the clamp 320 is inserted into the recess 160 and/or when the switch 365 is in the open state.

Thus, the invention provides, among other things, a clamp meter that includes a detachable clamp and a storage area for receiving the detachable clamp when the detachable clamp is not in use. Various features and advantages of the invention are set forth in the following claims.

What is claimed is:

1. A clamp meter comprising:
a clamp including a measurement end and a handle portion, the measurement end including a first measurement portion and a second measurement portion, the handle portion including a first handle and a second handle; and
a housing including a recess, the recess configured to removably receive the clamp when the clamp is not in use, the housing connected to the clamp via a cord,
wherein, when the clamp is received in the recess, the first measurement portion and the second measurement portion are positioned completely within the recess, the first handle and the second handle extend at least partially from the recess, and the recess prevents the clamp from being used, and
wherein the clamp is capable of being removed from the recess in a one-handed use position.

2. The clamp meter of claim 1, further comprising a switch for disabling the clamp when the clamp is received in the recess.

3. The clamp meter of claim 2, wherein the switch is in an open state when the clamp is received in the recess and a closed state when the clamp is removed from the recess.

4. The clamp meter of claim 1, wherein the clamp is operable to sense a current passing between the first measurement portion and the second measurement portion when the clamp is removed from the recess.

5. The clamp meter of claim 1, wherein the one-handed use position does not require the user to manipulate a grip on the first handle and the second handle after removing the clamp from the recess.

6. The clamp meter of claim 1, further comprising a cord management system configured to secure the cord to the clamp meter.

7. The clamp meter of claim 6, wherein the cord management system includes a protrusion around which the cord is capable of being wrapped.

8. The clamp meter of claim 6, wherein the cord management system includes one or more recesses for receiving the cord.

9. The clamp meter of claim 1, wherein the clamp further includes a pinch barrier between the first measurement portion and the second measurement portion.

10. The clamp meter of claim 1, further comprising an LED worklight.

11. The clamp meter of claim 10, wherein the LED worklight is operable when the clamp is received in the recess.

12. A method of operating a clamp meter, the clamp meter including a clamp, the clamp including a measurement end and a handle portion, the measurement end including a first measurement portion and a second measurement portion, the handle portion including a first handle and a second handle, the method comprising:
removably receiving the clamp in a recess of a housing when the clamp is not in use, the first measurement portion and the second measurement portion of the clamp being positioned completely within the recess and the first handle and the second handle extending at least partially from the recess, the clamp connected to the housing via a cord;
preventing the clamp from being used when the clamp is received in the recess; and
enabling use of the clamp when the clamp is removed from the recess.

13. The method of claim 12, further comprising disabling the clamp when the clamp is received in the recess.

14. The method of claim 13, wherein the clamp is disabled by a switch, the switch being in an open state when the clamp is received in the recess and a closed state when the clamp is removed from the recess.

15. The method of claim 12, further comprising sensing a current passing between the first measurement portion and the second measurement portion when the clamp is removed from the recess.

16. The method of claim 15, further comprising displaying an indication of the sensed current on a display.

17. The method of claim 12, wherein the clamp is removed in a one-handed use position, wherein the one-handed use position does not require a user to manipulate a grip on the first handle and the second handle after removing the clamp from the recess.

18. The method of claim 12, wherein the measurement end of the clamp is received in the recess prior to the handle portion.

19. The method of claim 12, further comprising securing the cord to the clamp meter.

20. The method of claim 12, further comprising selectively activating an LED worklight when the clamp is received in the recess.

* * * * *